United States Patent
Puckett et al.

(10) Patent No.: US 9,093,125 B2
(45) Date of Patent: Jul. 28, 2015

(54) LOW VOLTAGE WRITE SPEED BITCELL

(71) Applicant: QUALCOMM Incorporated, San Diego, CA (US)

(72) Inventors: Joshua L. Puckett, Raleigh, NC (US); Manish Garg, Morrisville, NC (US); Harish Shankar, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 122 days.

(21) Appl. No.: 13/746,528

(22) Filed: Jan. 22, 2013

(65) Prior Publication Data

US 2013/0188434 A1    Jul. 25, 2013

Related U.S. Application Data

(60) Provisional application No. 61/589,570, filed on Jan. 23, 2012.

(51) Int. Cl.
| | | |
|---|---|---|
| G11C 7/00 | (2006.01) | |
| G11C 11/412 | (2006.01) | |
| G11C 11/419 | (2006.01) | |

(52) U.S. Cl.
CPC .............. *G11C 7/00* (2013.01); *G11C 11/412* (2013.01); *G11C 11/419* (2013.01)

(58) Field of Classification Search
CPC ....... G11C 7/1078; G11C 7/22; G11C 7/1006
USPC ..................................... 365/189.16, 226, 154
See application file for complete search history.

(56) References Cited

U.S. PATENT DOCUMENTS

| | | | |
|---|---|---|---|
| 5,668,770 A | 9/1997 | Itoh et al. | |
| 6,925,025 B2 * | 8/2005 | Deng et al. | 365/226 |
| 7,460,400 B1 | 12/2008 | Kikuchi | |
| 7,630,228 B2 | 12/2009 | Riley et al. | |
| 7,710,815 B2 * | 5/2010 | Chang | 365/230.05 |
| 7,718,482 B2 * | 5/2010 | Ekbote et al. | 438/200 |
| 7,839,173 B1 | 11/2010 | Zhang et al. | |
| 8,331,187 B2 * | 12/2012 | Houston et al. | 365/226 |
| 8,451,652 B2 * | 5/2013 | Seikh et al. | 365/154 |
| 2007/0127298 A1 | 6/2007 | Yamamura | |
| 2007/0189102 A1 | 8/2007 | Lin et al. | |
| 2007/0236983 A1 | 10/2007 | Wang et al. | |
| 2009/0086556 A1 | 4/2009 | Wijeratne et al. | |
| 2011/0235445 A1 | 9/2011 | Hwang et al. | |
| 2012/0002500 A1 | 1/2012 | Lin | |

OTHER PUBLICATIONS

International Search Report and Written Opinion—PCT/US2013/022777—ISA/EPO—Jun. 13, 2013.
Pilo, et al., "An SRAM Design in 65-nm Technology Node Featuring Read and Write-Assist Circuits to Expand Operating Voltage," IEEE Journal of Solid-State Circuits, vol. 42, No. 4, Apr. 2007, pp. 813-819.

* cited by examiner

*Primary Examiner* — Connie Yoha
(74) *Attorney, Agent, or Firm* — Paul S. Holdaway

(57) ABSTRACT

In low power CPUs, the best way to reduce power is to reduce supply voltage. Most low voltage memory arrays use an 8T cell, which has read stability immunity, in order to operate at low voltages. An embodiment of the disclosure determines when a write wordline (WWL) rises. If the determination shows that the WWL has risen, at least one of the plurality of p-channel field effect transistors (pFETS) is disconnected from a voltage supply, and the at least one plurality of n-channel field effect transistors (nFET) passgate transistors are opened.

35 Claims, 13 Drawing Sheets

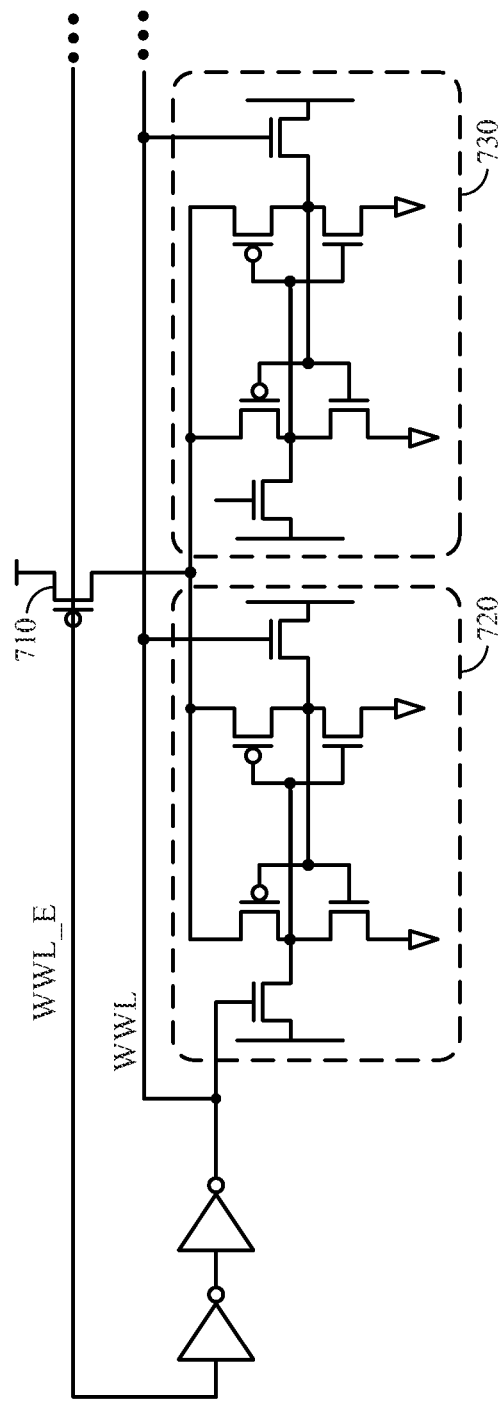

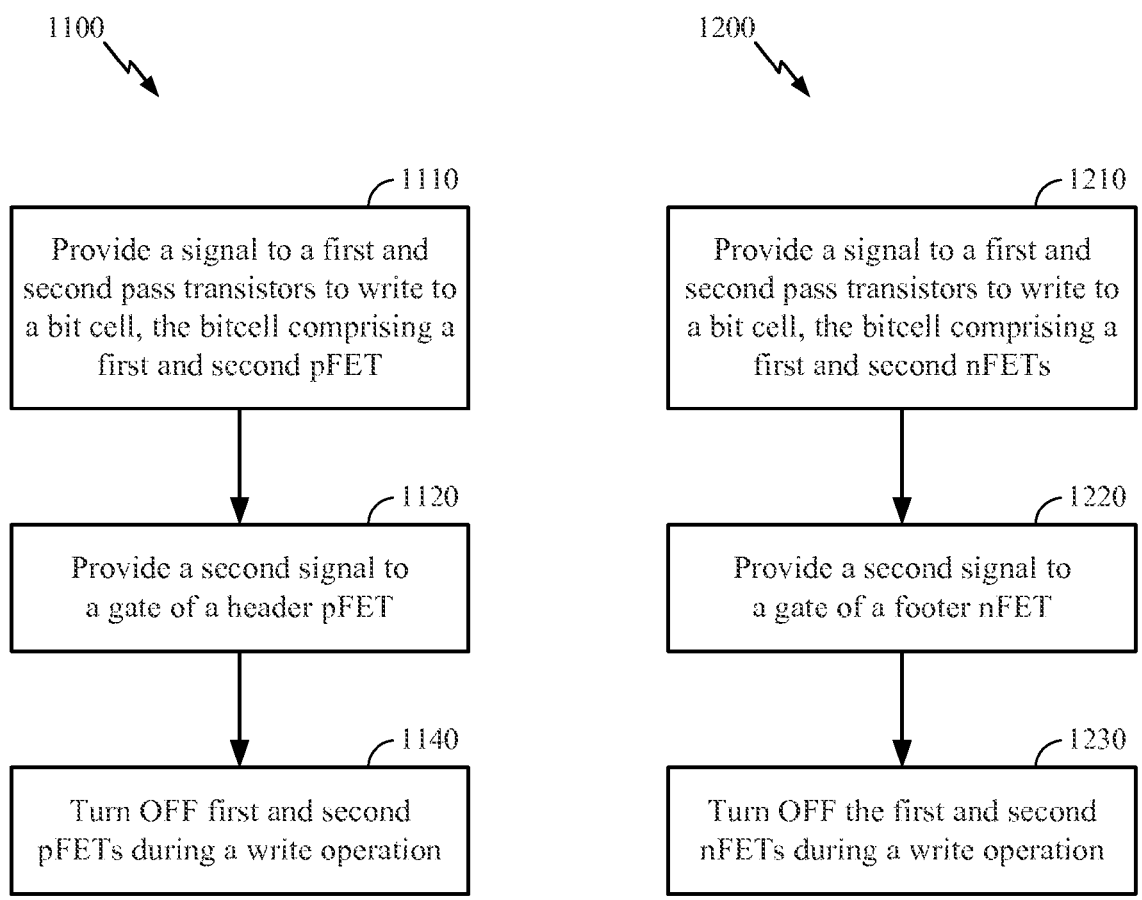

LOW VOLTAGE WRITE SPEED BITCELL

CLAIM OF PRIORITY UNDER 35 U.S.C. §119

The present Application for Patent claims priority to Provisional Application No. 61/589,570 entitled "IMPROVED LOW VOLTAGE WRITE SPEED BITCELL" filed Jan. 23, 2012, and assigned to the assignee hereof and hereby expressly incorporated by reference herein.

FIELD OF DISCLOSURE

This disclosure relates to improving the performance of memories, especially for low voltage applications. More particularly, the performance improvement of low voltage write speed bitcells is disclosed, as well as the improvements in eight transistor (8T) bitcells.

BACKGROUND

Manufacturers of electrical devices such as computers continue to strive to make these devices more efficient. One way to make these devices more efficient is to lower the operating voltage of the device. Hence, many of these devices utilize low voltage processors. Many low voltage processors can operate with a supply voltage of less than one volt. Such low voltage operation allows a device such as a computer to save significant power and run on battery power for extended periods of time. Furthermore, with the advent of multi-core processors, power conservation has become more important for devices such as laptop computers.

New manufacturing technologies such as technologies that can manufacture integrated circuit components that are smaller than 65-nm have created many additional technological challenges for designers of low voltage systems. One such challenge is related to higher intrinsic device variations associated with sub 65-nm manufacturing technology, such as variations in device leakage (Le) and threshold voltages (Vt). Sensitivity of circuit parameters such as device switching at such low voltages due to manufacturing defects is another challenge for designers.

Generally, the minimum operating voltage (Vcc min) of a processor is limited by a minimum voltage that is required by memory systems in order to read from and write to memory cells. It can be appreciated that the amount of high performance data storage (i.e. memory cells) being incorporated with processors is ever increasing. Low voltage sub 65-nm processors that have low voltage, high performance memory typically have a significant yield loss during the testing and burn in procedure. These lower yields have made manufacturers of processors reconsider if lower voltages are economically feasible and what voltage levels are economically practical. Hence, there has been a trend to design and operate current processors at higher voltages than previous processors in an effort to provide an improved cost/performance trade off because of high performance memory problems. It can be appreciated that manufacturers are investing in alternate circuit topologies to the conventional memory structures that can operate at lower voltages and can be manufactured with higher yields.

While reducing the voltage potential of a power supply powering internal IC devices can be beneficial to IC device reliability and power consumption, at the circuit board or system level, the IC still may be coupled to components operating with higher power supply voltages. In that case, the IC may operate with two or more power supplies. Each power supply can provide a different voltage potential to the IC. Typically, one or more low voltage power supplies can be provided to power CMOS devices that drive internal circuits of the IC. One or more high voltage power supplies can be provided to power CMOS devices that receive signals from and/or send signals to, circuits external to the IC. For example, an IC can be provided with a 1.3V power supply for internal circuits and a 3.3V power supply for devices coupled to circuits external to the IC.

Circuits powered by power supplies with differing voltage potentials can output signals with different voltage ranges. For example, one digital circuit powered by a 1.8V power supply can output a signal that varies between 0-1.8V, while another digital circuit powered by a 3.3V power supply may output a signal that varies between 0-3.3V. The difference in signal levels between the two digital circuits can create problems at any interface between the two digital circuits.

For example, consider an interface where a CMOS inverter provides a maximum input voltage of 1.8V to a CMOS inverter operating at 3.3V. The 1.8V input, typically cannot disable a pull-up P-type field effect transistor (pFET) device within the CMOS inverter as −1.5V of gate terminal to source terminal voltage, i.e., 1.8V-3.3V, is being applied to the pFET device. A voltage of −1.5V, however, is sufficient to enable the pFET device. With 1.8V applied to the input of the 3.3V CMOS inverter, both the pull-up pFET device and a pull-down nFET device of the 3.3V CMOS inverter can be enabled simultaneously. In that case, the 3.3V CMOS inverter has a closed current path from the 3.3V power supply to ground when receiving a static input high of 1.8V. As such, the 3.3V CMOS inverter unnecessarily consumes power when in a static state.

In low power central processing units (CPUs), one way to reduce power is to reduce the supply voltage. In order to operate at low voltages, most low voltage memory arrays use an 8T cell, which provides read stability immunity.

However, as supply voltage is decreased, the decrease in performance is not linear. It becomes exponential as the supply is reduced nearer the Vt of the highest-Vt devices, which are typically found in memory arrays for leakage control reasons. In an 8T cell, the write speed limits frequency at low voltage and the various circuits and proposed embodiments disclosed herein solves and addresses many of these issues.

SUMMARY

The disclosure relates to improving the use and application of low voltage memory arrays in low voltage applications.

One exemplary embodiment discloses an apparatus comprising: a bitcell comprising a first pFET having a source and a drain; a second pFET having a source and a drain; a first passgate transistor having a first terminal and a second terminal connected to the drain of the first pFET; a second passgate transistor having a first terminal and a second terminal connected to the drain of the second pFET; a driver having an output port connected to the first terminals of the first and second passgate transistors; and a header pFET having a gate connected to the output port of the driver, and having a drain connected to the source of the first pFET and to the source of the second pFET, wherein the header pFET is configured to turn ON when the passgate transistors are OFF, and turn OFF, when the passgate transistors are ON. The apparatus further comprises a first common node and a second common node, wherein the first common node comprises a true bitline and the second common node comprises a complementary bit-line, wherein the first common node is operatively configured to connect to the second terminal of the first passgate transistor and the second common node is configured to connect to the second terminal of the second passgate transistor wherein the first common node and the second common node are driven to complementary logic voltages when performing a write operation on the bitcell, and wherein when the driver output is logic value HIGH, the header pFET turns OFF and causes the first pFET and second pFET to turn OFF. The apparatus further comprises a third pFET comprising a gate, wherein the gate is held LOW, the third pFET configured to be connected in parallel to the header pFET, wherein the header pFET is configured to turn ON when the passgate transistors are OFF, and turn OFF when the passgate transistors are ON, the apparatus further comprises a first common node and a second common node, wherein the first common node comprises a true bitline and the second common node comprises a complementary bitline, wherein the first common node is operatively configured to connect to the second terminal of first passgate transistor and the second common node is operatively configured to connect to the second terminal of the second passgate transistor and wherein the first common node and the second common node are driven to complementary logic voltages when performing a write operation on the bitcell.

Yet another exemplary embodiment discloses an apparatus comprising: a bitcell comprising a first pFET having a source and a drain; a second pFET having a source and a drain; a first passgate transistor having a first terminal and a second terminal connected to the drain of the first pFET; a second passgate transistor having a first terminal and a second terminal connected to the drain of the second pFET; a driver having an input port, and having an output port connected to the first terminals of the first and second passgate transistors; a header pFET having a gate connected to the input port of the driver, and having a drain connected to the source of the first pFET and to the source of the second pFET, wherein the header pFET is configured to turn ON when the passgate transistors are OFF, and turn OFF when the passgate transistors are ON. The apparatus further comprises a first common node and a second common node, wherein the first common node comprises a true bitline and the second common node comprises a complementary bitline, wherein the first common node is operatively configured to connect to the first terminal of the first passgate transistor and the second common node is configured to connect to the first terminal of the second passgate transistor wherein the first common node and second common node are driven to complementary logic voltages when performing a write operation on the bitcell.

In yet another exemplary embodiment, an apparatus is disclosed, comprising a bitcell comprising a first nFET having a source and a drain; a second nFET having a source and a drain; a first passgate transistor having a first terminal and a second terminal connected to the drain of the first nFET; a second passgate transistor having a first terminal and a second terminal connected to the drain of the second nFET; a driver having an output port connected to the first terminals of the first and second passgate transistors; and a footer nFET having a gate coupled to an input port of the driver and configured to receive a voltage complementary to the voltage of the output port of the driver, and having a drain connected to the source of the first nFET and the source of the second nFET. The apparatus further comprises a first pFET having a source and a drain, wherein the drain is connected to the terminal of the first passgate transistor; and a second pFET having a source and a drain, wherein the drain is connected to the terminal of the second passgate transistor. The apparatus further comprises a header pFET having a gate connected to the output port of the driver and further having a drain connected to the source of the first pFET and to the source of the second pFET, wherein the header pFET is configured to turn ON when the passgate transistors are turned OFF, and turn OFF when the passgate transistors are turned ON and wherein the footer nFET is configured to turn ON when the passgate transistors are turned OFF, and turn OFF when the passgate transistors are turned ON. The apparatus further comprises a third pFET comprising a gate, wherein the gate is held LOW, the third pFET configured to be connected in parallel to the header pFET and a third nFET comprising a gate, wherein the gate is connected to a supply rail, the third nFET configured to be connected in parallel to the footer nFET. The apparatus further comprises a first common node and a second common node, wherein the first common node comprises a true bitline and the second common node comprises a complementary bitline, wherein the first common node is operatively configured to connect to the second terminal of first passgate transistor and the second common node is operatively configured to connect to the second terminal of the second passgate transistor, wherein the first common node and the second common node are driven to complementary logic voltages when performing a store operation on the bitcell and wherein when the driver output is logic value HIGH, the header pFET turns OFF, further causing the first pFET and second nFET to turn OFF.

Yet another exemplary embodiment discloses a method comprising providing a signal to a first and a second pass transistors to write to a bitcell, the bitcell comprising a first pFET having a source and a drain, and a second pFET having a source and a drain; and providing a second signal to a gate of a header pFET, wherein the header pFET comprises a drain connected to the sources of first and second pFETs, wherein providing second signal to the gate of the header pFET further includes turning OFF the first and second pFETs during a writing operation, wherein the second signal lags the first signal.

Yet another exemplary embodiment discloses a method comprising providing a signal to a first and a second pass transistors to write to a bitcell, the bitcell comprising a first nFET having a source and a drain, and a second nFET having a source and a drain; and providing a second signal to a gate of a footer nFET, wherein the footer nFET comprises a drain connected to the sources of first and second nFETs, wherein providing second signal to the gate of the footer nFET further includes turning OFF the first and second nFETs during a writing operation.

Yet another exemplary embodiment discloses an apparatus comprising: means for providing a signal to a first and a second pass transistors to write to a bitcell, the bitcell comprising a first nFET having a source and a drain, and a second nFET having a source and a drain; and means for providing a second signal to a gate of a footer nFET, wherein the footer nFET comprises a drain connected to the sources of first and second nFETs, wherein providing second signal to the gate of the footer nFET further comprises means for turning OFF the first and second nFETs during a writing operation.

Yet another exemplary embodiment discloses an apparatus comprising means for providing a signal to a first and a second pass transistors to write to a bitcell, the bitcell comprising a first nFET having a source and a drain, and a second nFET having a source and a drain; and means for providing a second signal to a gate of a footer nFET, wherein the footer nFET comprises a drain connected to the sources of first and second nFETs, wherein providing second signal to the gate of the footer nFET further includes means for turning OFF the first and second nFETs during a writing operation.

BRIEF DESCRIPTION OF THE DRAWINGS

The accompanying drawings are presented to aid in the description of embodiments of the invention and are provided solely for illustration of the embodiments and not limitation thereof.

FIG. 7a illustrates an exemplary embodiment of a pFET header that is shared between adjacent cells to save area in accordance with at least one embodiment of the invention

FIG. 11 illustrates an exemplary embodiment of a method for improved low voltage write speed to a bitcell with a pFET header design.

FIG. 12 illustrates an exemplary embodiment of a method for improved low voltage write speed to a bitcell with an nFET footer design.

DETAILED DESCRIPTION

Figure 1:
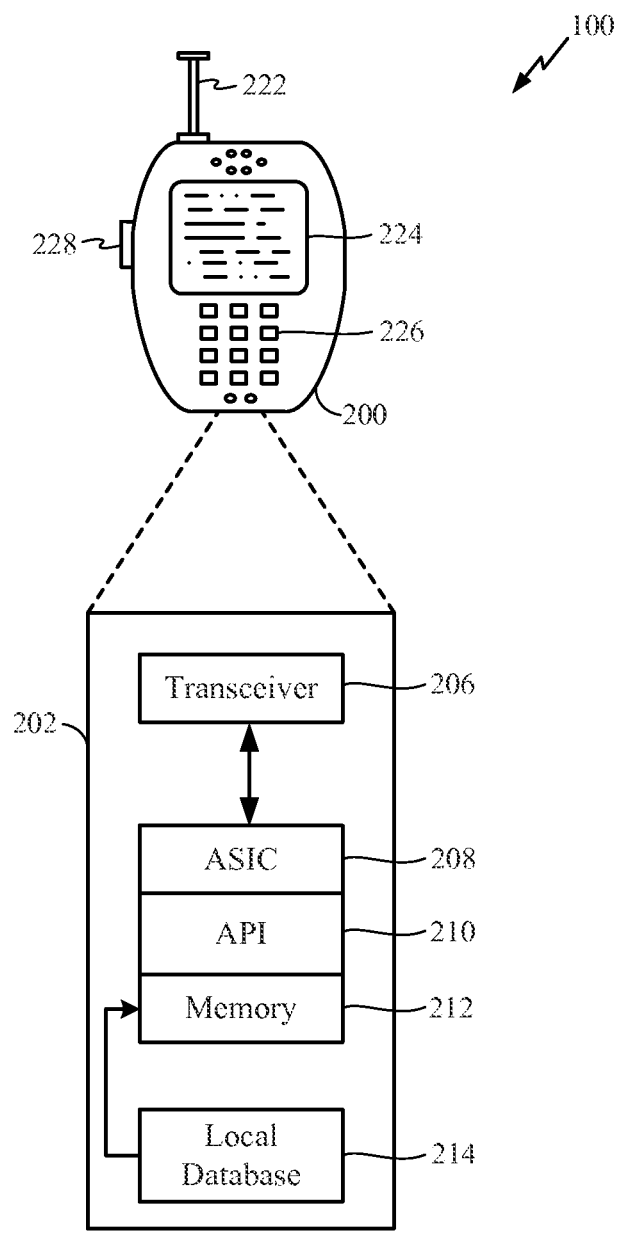
FIG. 1 illustrates exemplary user equipment (UE) in accordance with at least one embodiment of the invention.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

In the description herein, the term "write" is used synonymously with "store" operations as is known in the art. Likewise, the term "read" is used synonymously with "load." Further, in the description, references may be made to read/write operations pertaining to "cache blocks," which may refer to a granularity less than that of an entire cache line. However, it will be understood that such references are merely for illustrative purposes and shall not be construed as limiting the scope of the embodiments. For example, disclosed techniques may be easily extended to operations on any other granularity as applicable, such as a cache word, cache line, etc. Further, it will also be understood that the referenced cache block may comprise data or instructions, even though the description may be provided in terms of write/read operations of data alone. Additionally, references to lower levels of memory hierarchy may include backing storage elements beyond local or first level (L1) caches which may be associated with processors or processing elements. For example, references to lower levels of memory hierarchy herein may refer to second level (L2) caches, main memory, and one or more levels of memory structures which may be present between L2 caches and main memory.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

It will be appreciated that configured logic or "logic configured to" are not limited to specific logic gates or elements, but generally refer to the ability to perform the functionality described herein (either via hardware or a combination of hardware and software). Thus, the configured logics or "logic configured to" are not necessarily implemented as logic gates or logic elements despite sharing the word "logic." Other interactions or cooperation between the logic in the various blocks will become clear to one of ordinary skill in the art from a review of the embodiments described below in more detail.

Referring to FIG. 1, a system 100 that includes a UE 200, (here a wireless device), such as a cellular telephone, which has a platform 202 that can receive and execute software applications, data and/or commands transmitted from a radio access network (RAN) that may ultimately come from core network 126, the Internet and/or other remote servers and networks. Platform 202 can include transceiver 206 operably coupled to an application specific integrated circuit ("ASIC" 208), or other processor, microprocessor, logic circuit, or other data processing device. ASIC 208 or other processor executes the application programming interface ("API") 210 layer that interfaces with any resident programs in memory 212 of the wireless device. Memory 212 can be comprised of read-only or random-access memory (RAM and ROM), EEPROM, flash cards, or any memory common to computer platforms. Platform 202 also can include local database 214 that can hold applications not actively used in memory 212. Local database 214 is typically a flash memory cell, but can be any secondary storage device as known in the art, such as magnetic media, EEPROM, optical media, tape, soft or hard disk, or the like. Internal platform 202 components can also be operably coupled to external devices such as antenna 222, display 224, push-to-talk button 228 and keypad 226 among other components, as is known in the art.

Accordingly, an embodiment of the disclosure can include a UE including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of UE 200 in FIG. 1 are to be considered merely illustrative and the invention is not limited to the illustrated features or arrangement.

The wireless communication between UE 200 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network. Accordingly, the illustrations provided herein are not intended to limit the embodiments of the invention and are merely to aid in the description of aspects of embodiments of the invention.

Figure 2:
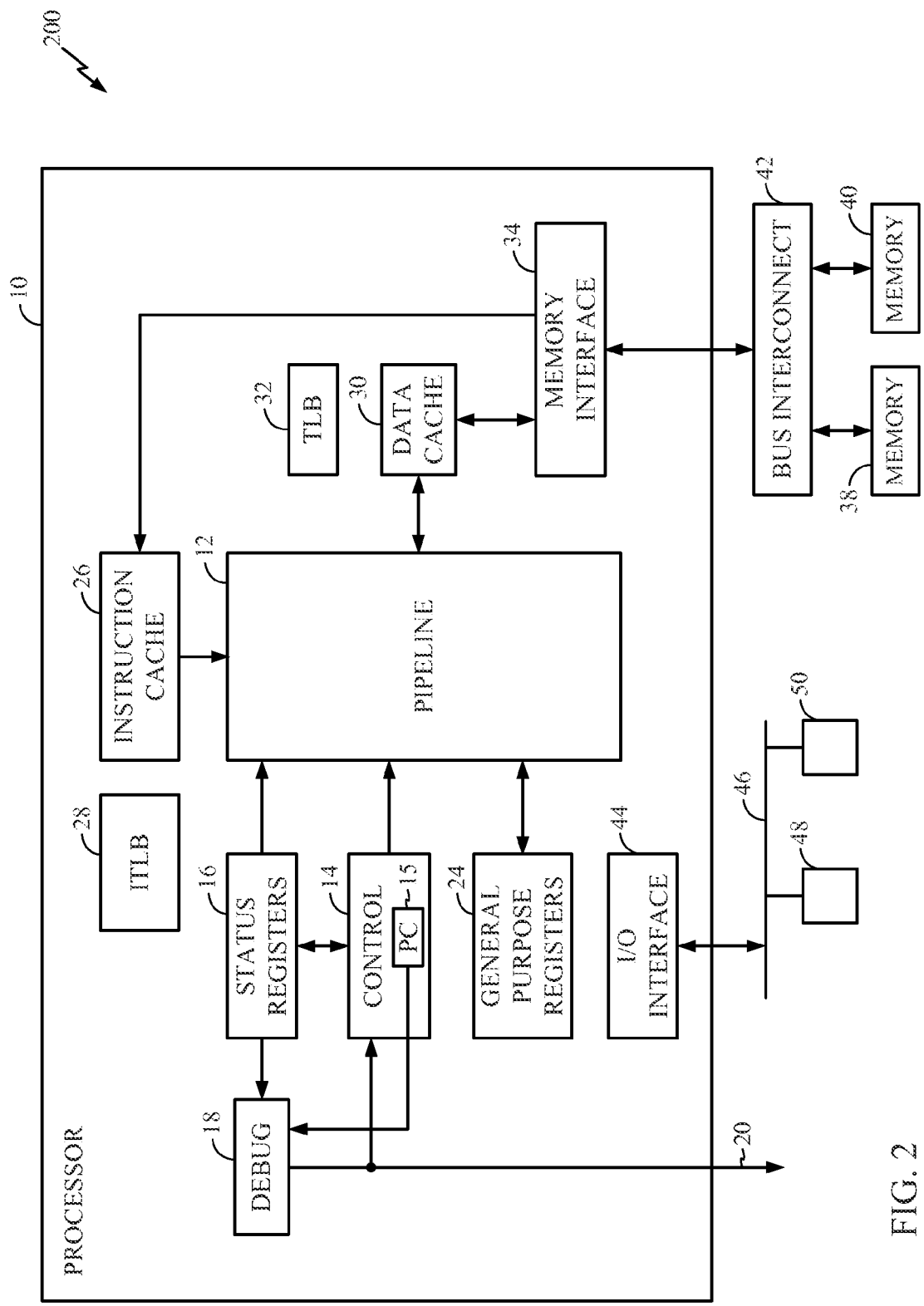
FIG. 2 illustrates an exemplary processor in accordance with at least one embodiment of the invention.

FIG. 2 depicts a functional block diagram 200 of an exemplary processor 10, such as an ASIC 208 configured to incorporate features of the improved low voltage write speed to bitcell. Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some embodiments, pipeline 12 may be a superscalar design, with multiple, parallel pipelines. Pipeline 12 may also be referred to as an execution unit. A General Purpose Register (GPR) file 20 provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two. Debug circuit 18 is described in greater detail below.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various embodiments, ITLB 28 may comprise a copy of part of TLB 32. Alternatively, ITLB 28 and TLB 32 may be integrated. Similarly, in various embodiments of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master input to a bus interconnect 42 implementing a shared bus to one or more memory devices 38, 40 that may incorporate the improved low voltage write speed in accordance with one exemplary embodiment of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular embodiment. Other functional blocks that may reside in processor 10, such as a JTAG controller, instruction pre-decoder, branch target address cache, and the like are not germane to a description of the present invention, and are omitted for clarity.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Figure 3:
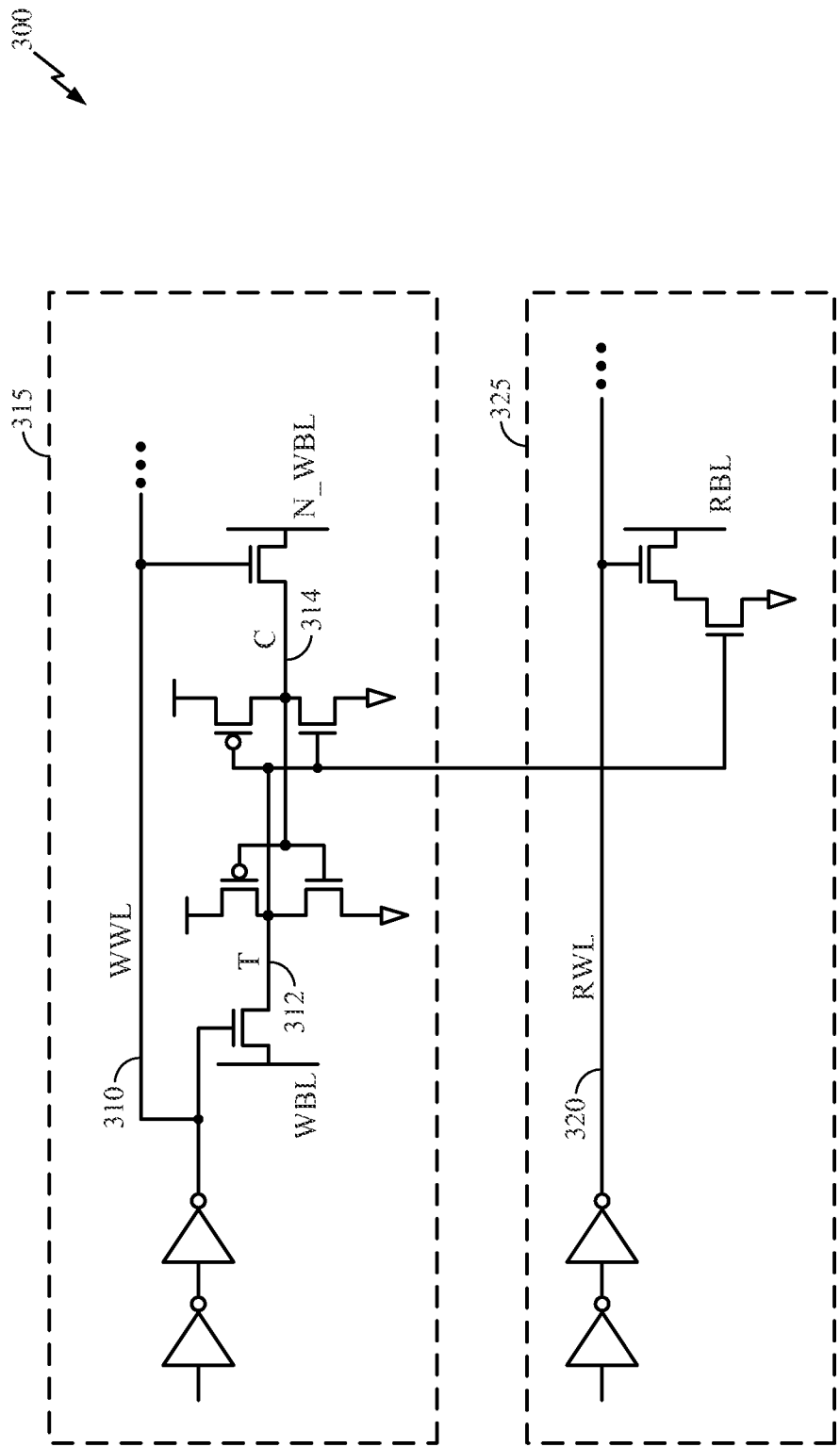
FIG. 3 illustrates a conventional eight transistor (8T) bitcell with write wordline (WWL) and read wordline (RWL) drivers.

FIG. 3 depicts a conventional 8T bitcell transistor circuit 300 with write wordline (WWL) drivers 310 and read wordline (RWL) drivers 320. An eight transistor (8T) bitcell is a single-read and single-write port bitcell based on the six transistor (6T) bitcell that decouples write port 315 and read port 325 in order to eliminate read stability issues. This scheme enables the optimization of the 6T portion to perform writability and increase write speed in write port 315 and allows optimization of the read speed using the two transistors (2T) read port 325. Bitcells on a row share the same WWL and RWL and bitcells on the same column share read bitlines (RBL), true bitline 312 and complimentary bitline 314. True bitline 312 is selectively coupled to a common true node through an n-type pass device (nFET) and a p-type pass device (pFET) in series, and complementary bitline 314 is selectively coupled to a common complementary node through an nFET and a pFET in series therewith. The common true node is denoted as T and common complimentary node is denoted as C.

In low power CPUs, one of the common ways to reduce power is to reduce supply voltage (VDD). As VDD is scaled down, the pFETs' strength is degraded more heavily than nFETs' strength because p-type devices have higher threshold voltage (Vt) due to hole versus electron mobility resulting in drain current (Id) being non-linear as supply voltage approaches Vt. The supply voltage may be connected to a supply rail (not shown). Furthermore, as supply voltage is decreased, the decrease in performance is not linear, and it becomes exponential as the supply is reduced nearer to Vt of the highest-Vt devices which are typically found in memory arrays for leakage control reasons.

In the bitcell, these operating characteristics have ramifications for both data retention and write speed. As VDD approaches Vt, the hold-Signal Noise Margin (SNM), which is the data retention figure of merit for Static Random Access Memory (SRAM), is degraded because the voltage scale-down causes the leakage current of the nFET to become comparable to the saturation current of the pFET. This degradation also adversely impacts the write speed because at low voltage, the pFETs have to pull up the input to HIGH as the nFETs only get a very weak HIGH. Since the ratio of nFETs/pFETs is usually 2-3×, the pFETs tend to be very weak and this speed will dictate the minimum write time at low voltage (the minimum time WWL 310 needs to be HIGH in order to write the cell).

The most straightforward way to improve the data retention and write speed with regard to weak pFETs at low voltage is to upsize or use a lower Vt device. However, this is not an optimal solution, since it will make the cell's writability degrade at all voltages (more contention from the pFET means the nFET will have a harder time flipping the node) and this leads to increased leakage.

Figure 4:
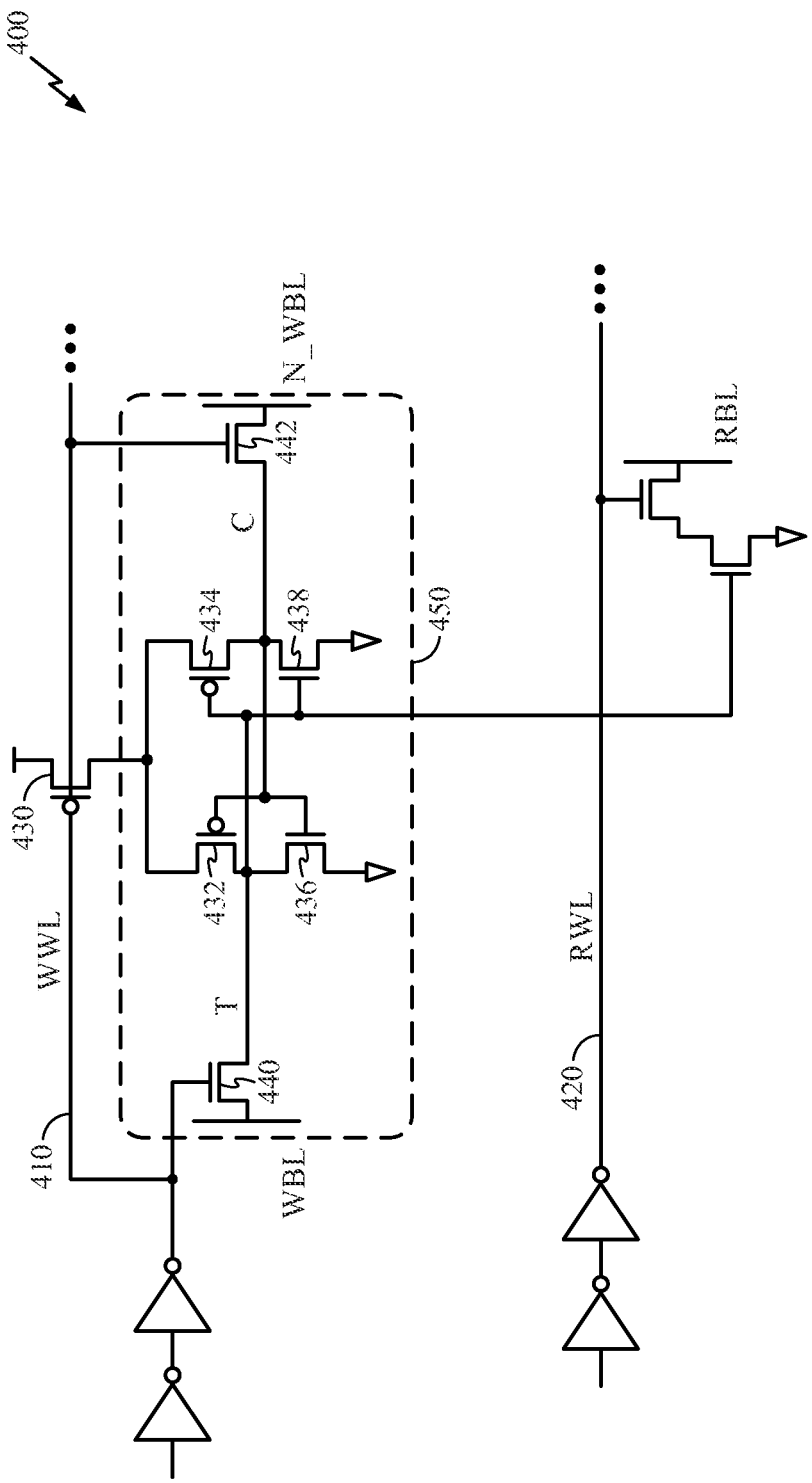
FIG. 4 illustrates an exemplary embodiment of a proposed nine transistor (9T) bitcell with write wordline (WWL) and read wordline (RWL) drivers in accordance with at least one embodiment of the invention.

FIG. 4 illustrates an exemplary circuit 400 of a proposed nine transistor (9T) bitcell with write wordline (WWL) 410 and read wordline (RWL) driver 420 in accordance with an embodiment of the invention. Circuit 400 includes a pFET header 430 to each bitcell, allowing for very fast write speed and good data retention while not compromising write noise margin. This solution decouples the nFET-pFET contention issue with the retention/pFET-speed issue. The contention between nFETs and pFETs occurs during signal propagation. This means that when there's a transition delay between an input and an output wherein the input transitions to HIGH, there is contention between the outputting pFET (for example pFET 432) and the receiving nFET (for example nFET 436). During this transition phase, a shoot-through current goes from VDD through pFET and nFET, resulting in substantial power loss. The decoupling thus means that 2-3× NP ratios are no longer needed and therefore either nFETS can be sized down or pFETS sized up. Since the pFET leakage path is now through a series of transistors, the use of low Vt is also a viable application.

This approach eliminates the nFET-pFET contention that happens during write operations because during write operations of the cell, header pFET 430 is effectively turned OFF, causing pFETS 432 and 434 to be turned OFF as well. After write operations take place, header pFET 430 and pFETS 432 and 434 turn ON and their strength can be strong enough to mitigate retention issues and increase the transition speed by which the side of the cell is being written to 1. The side in this instance is the WBL side, wherein the opposite side is N_WBL side. For example, in this case, WBL writes to node T while N_WBL writes to node C.

The addition of a pFET 430 as a bitcell header controlled by WWL 410 illustrates that when WWL 410 rises, the pFETS 432 and 434 are disconnected from the supply voltage, causing the nFET passgate transistors 440 and 442 to open. As a result there is very little contention which leads to having internal nodes T or C to pull down very fast. When WWL 410 goes to LOW, header pFET 430 and pFETs 432 and 434 are turned ON and the appropriate side is snapped up to VDD. For example, the appropriate side would be the side which was connected to VDD via the nFET passgate transistors 440 and 442. Therefore, if WBL is HIGH and N-WBL is LOW, the write node T is pulled up to VDD. Additionally, when WWL 410 is HIGH, header pFET 430 is turned OFF, which allows for the decoupling between pFET 432 and nFET 436, leading to reduced contention as discussed above, wherein, for example, nFET 436 is no longer contending with pFET 432 to hold pFET 432 to a value HIGH for longer periods of time.

Circuit 400 also includes a bitcell 450 that includes a first pFET 432 having a source and a drain, a second pFET 434 having a source and a drain, a first passgate transistor 440 having a first terminal and a second terminal connected to the drain of the first pFET 432, a second passgate transistor 438 having a first terminal and a second terminal connected to the drain of the second pFET 434. Circuit 400 further includes a driver having an output port (WWL 410) connected to the first terminals of the first and second passgate transistors 440 and 442 and a header pFET 430 having a gate connected to the output port (WWL 410) of the driver, and having a drain connected to the source of the first pFET 432 and to the source of the second pFET 434. Header pFET 430 is configured to turn ON when the passgate transistors 440 and 442 are OFF, and turn OFF, when the passgate transistors 440 and 442 are ON. Circuit 400 further includes a first common node (T) and a second common node (C), wherein node T comprises a true bitline and node C comprises a complementary bitline and wherein node T is operatively configured to connect to the second terminal of the first passgate transistor 440 and node C is configured to connect to the second terminal of the second passgate transistor 442. Additionally, node T and node C may be configured to be driven to complementary logic voltages when performing a write operation on the bitcell. When the driver output port (WWL 410) is logic value HIGH, the header pFET 430 turns OFF and causes the first pFET 432, and second pFET 434 to turn OFF. Circuit 400 further comprises a pFET as an alternative embodiment and will be discussed in FIG. 8 below.

Figure 5:
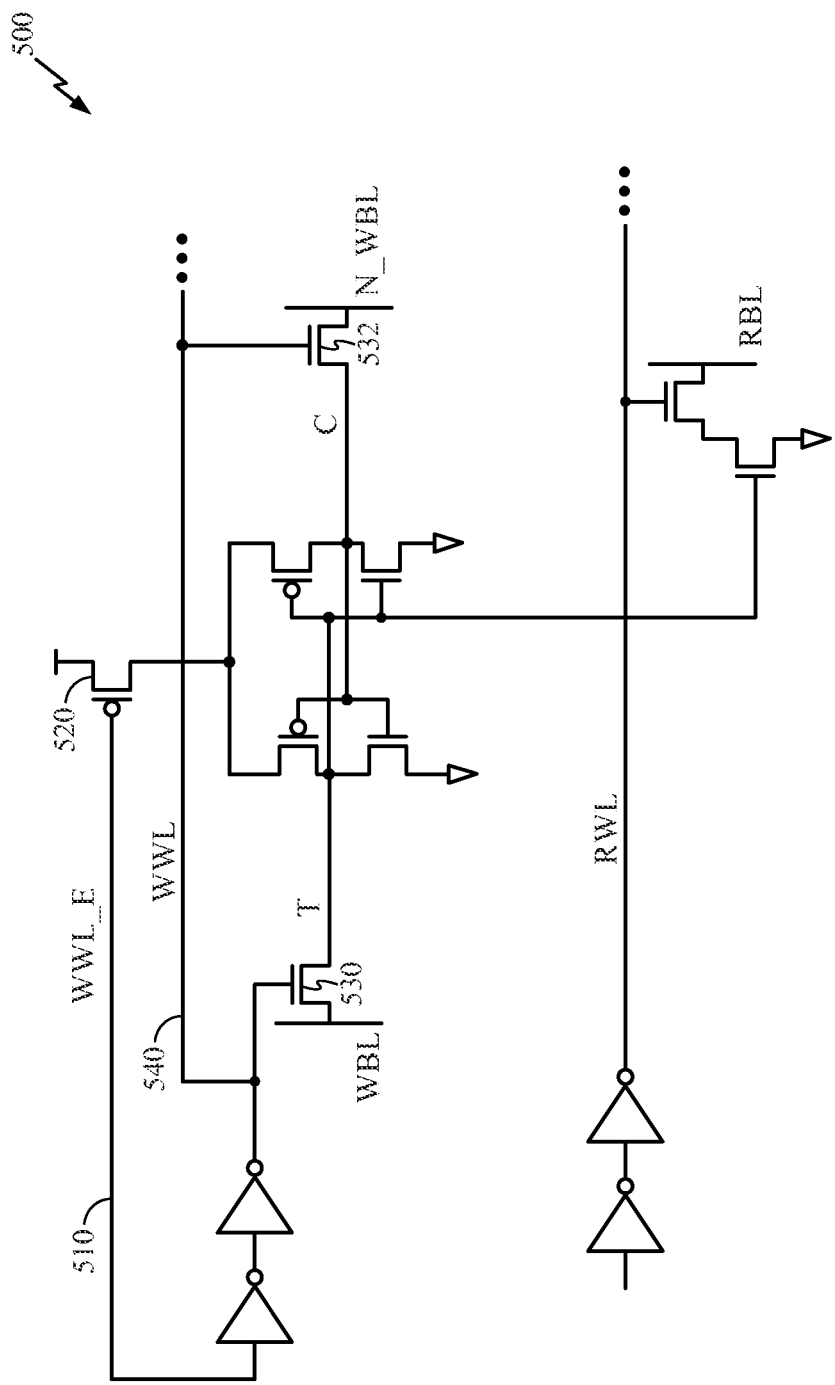
FIG. 5 illustrates an exemplary embodiment of a nine transistor (9T) bitcell with early write wordline (WWL_E) for positive channel field effect transistors (pFET) headers in accordance with at least one embodiment of the invention.

FIG. 5 illustrates an exemplary embodiment of circuit 500 including a nine transistor (9T) bitcell with early write wordline (WWL_E) for positive channel field effect transistor (pFET) headers in accordance with at least one embodiment of the invention. Circuit 500 includes a separate wordline (WWL_E) 510 which is used to provide an early signal to drive pFET header 520. This approach allows for the circuit to have greater noise immunity. The write wordline is delayed to the nFET passgate transistors 530 and as a result, once nFET passgate transistors 530 turn ON, pFET header 520 is completely OFF (from WWL_E 510 rising) and therefore there is no contention (leading to increased writability). When WWL 540 goes back to LOW, pFET header 520 first turns ON, which transitions node T to be driven to a HIGH very quickly, before nFET passgate transistor 530 is turned OFF. The quick transition of node T is due to the fact that there is no contention at this point which would be like a normal slew rate in the rest of the logic. When there's contention, for example, and especially at low voltages, the transition rate becomes very slow. This may be further illustrated in FIG. 6 below. The fast transition capability of this embodiment means that this design may be more noise immune than the first embodiment discussed above. However, this requires enough metal resources for a second write-wordline.

To allow very fast write speed and good data retention without compromising write noise margins, a pFET header 520 to each bitcell may be incorporated as illustrated above. Alternatively, an nFET footer circuit may also be incorporated as a viable alternative to achieve the same objectives, or even a more robust combination of a pFET header and nFET footer together in one circuit as will be discussed further below. Each of these solutions decouples the nFET-pFET contention issue with the retention/pFET-speed issue such that 2-3× NP ratios are no longer needed and therefore either nFETS can be sized down or pFETS sized up. Since the pFET leakage path is now through a series of transistors, using low Vt is also viable.

To ensure that noise issues in the circuit do not affect the writing of the bitcell and that the correct wordline is written, WWL 540 may be delayed to the nFET passgate transistors 530 and such that once the nFET passgate transistors 530 turn on, the pFET header 520 is completely OFF as a result of the rise of WWL_E 510. This feature further eliminates the contention (which results in increased writability). When WWL 540 goes back high the pFET header first turns ON, resulting in quickly charging up node T to a HIGH before the nFET passgate transistors 530 are turned OFF, which further improves the circuit noise immunity. With regards to immunity, it can be seen from the first embodiment illustrated in FIG. 4, that when WWL 410 is transitioning to a LOW, there is a brief time wherein neither the passgate transistor 440 nor the pFET header are fully ON. Such a scenario illustrates that the internal nodes (T and C) do not have a real path to power, and therefore, if a noise event happens, thereby coupling noise to an internal net happens, it could flip the node in theory. To further guard against such possible vulnerabilities, the embodiment illustrated in FIG. 5, which embodies having pFET header 520 control earlier than WWL 540 being HIGH ensures that there is a good path to VDD to reject noise events. Passgate transistors 530 may be nFETs, pFETs or a combination thereof, such that when the passgate transistors 530 are ON, the header pFET is OFF.

Figure 6A:
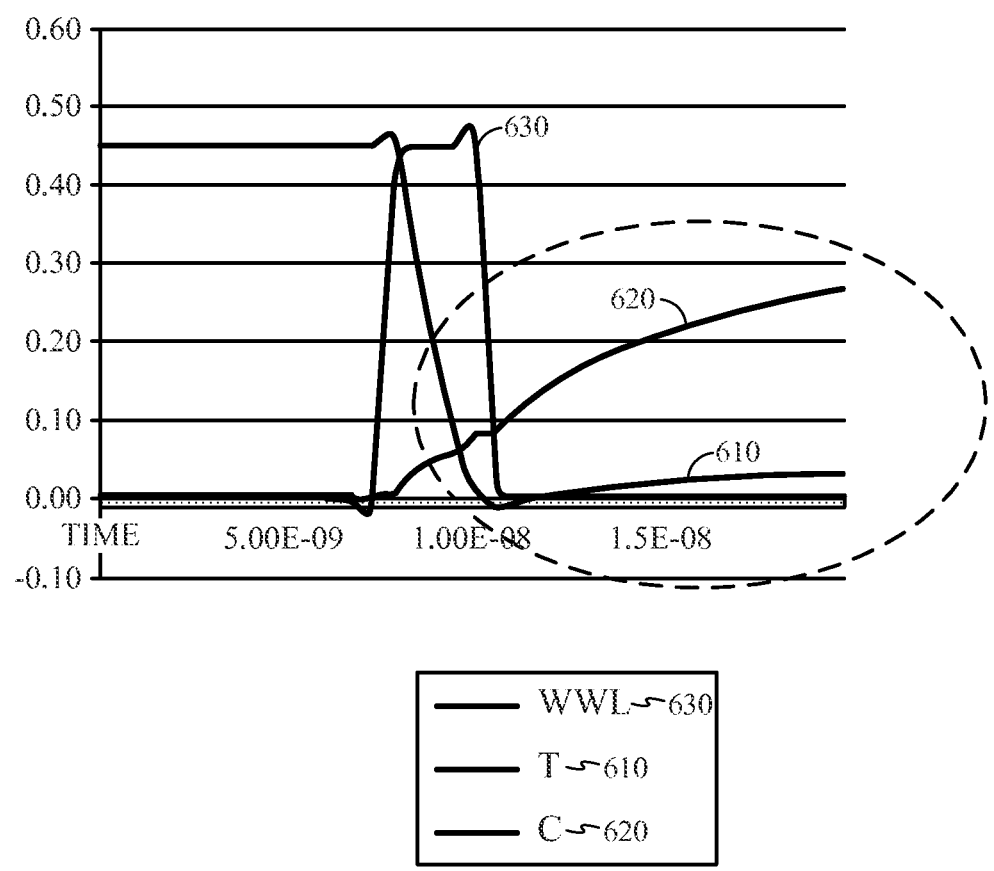
FIG. 6a illustrates a conventional bitcell write at low voltage and high-speed with a short WL pulsewidth.
Figure 6B:
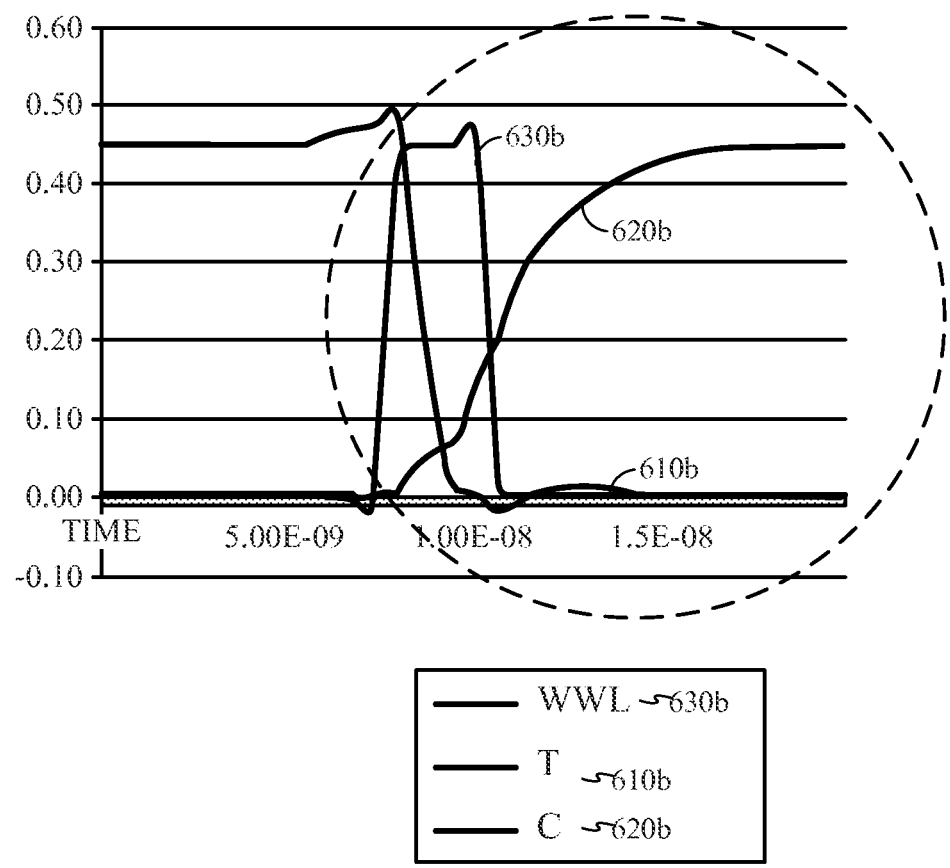
FIG. 6b illustrates an exemplary embodiment of a bitcell write at low voltage and high-speed with a short WL pulsewidth.

FIGS. 6a and 6b illustrate the advantages of the proposed solution to reduce contention by giving examples of low voltage operation of the conventional 8T cell versus the operations of the proposed 9T cell. The nodes T and C are the internal nodes of the bitcell that must flip for the cell to be written. This means that where one node is HIGH, the other node must go to LOW, and vice versa. When the frequency is increased, the wordline pulse width shrinks, causing the conventional bitcell to write very slowly. For example, in FIG. 6a, wordline pulse 630 triggers the flipping of the internal nodes, which causes the value of node T 610 to fall and the value of node C 620 to rise. The value of node T 610 takes a long time to fall back down to zero and thus the new design may be utilized to remedy this problem as demonstrated in FIG. 6b. As can be seen, the slow rise of node C 620 indicates a slow write operation.

Figure 7B:
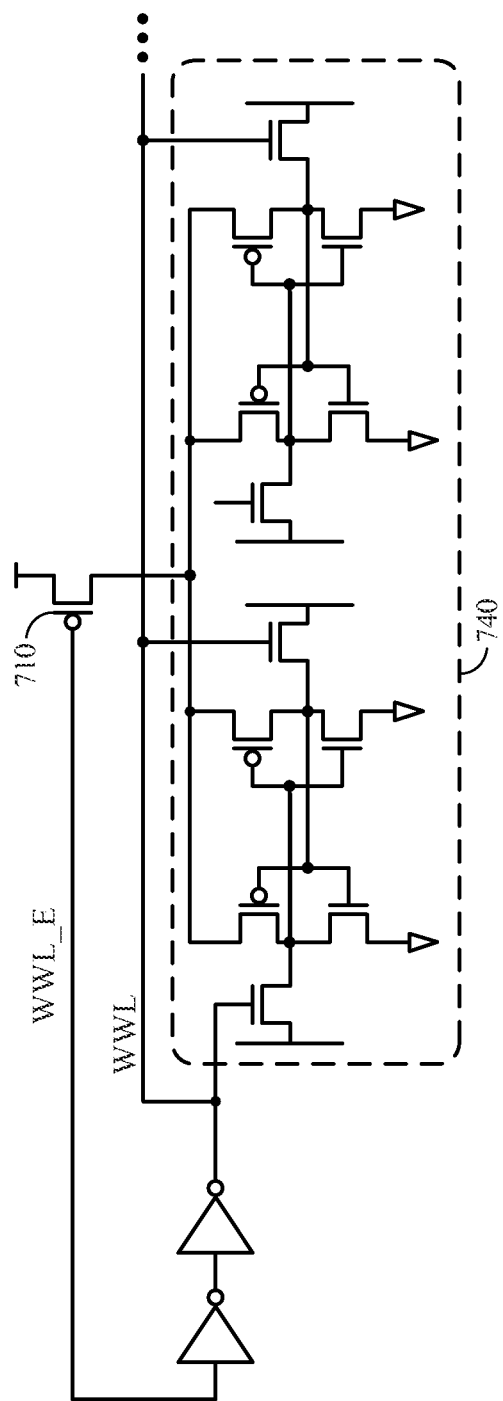
FIG. 7b illustrates an exemplary embodiment of a pFET header that is shared across an entire row.

Conversely in FIG. 6b, line 610b illustrates that the new bitcell has little problem with the pull down operation because the bitcell decouples the write of each side of the bitcell into opposite phases of the WWL. The term bitcell could indicate a bitcell that includes a header pFET, such as header pFET 520, or can also include only the pFET-nFET inverter circuit along with the passgates in designs that utilize a single pFET header that is shared across multiple cells up to the entire row, for example, as illustrated in FIG. 7a and FIG. 7b. This is achieved because each bitcell on a row could have the same control signal, so the pFET header could be shared across the row as opposed to having a single pFET header for each bitcell.

Looking at node C 620b, it can be seen that the fast rise time of node C 620b illustrates a fast write operation. For example, a conventional bitcell write (shown in FIG. 6a) at low voltage and high speed results in a slow transition at node C 620 as a result of a drop in the wordline pulse 630. However, looking at the same drop in the wordline pulse 630b, the response at node C 620b can be illustrated as a much faster transition time. A faster transition time can also be illustrated by looking at node T 610b wherein the voltage is dropped to zero at a faster rate than before at node T 620 wherein the voltage does not remain at zero. Therefore, this proposed bitcell provides a solution to improved write speed in low-voltage applications.

In another embodiment, and as discussed above, FIGS. 7a and 7b illustrate embodiment wherein the pFET header can be shared between adjacent bits (FIG. 7a) or all bits on the same row, (FIG. 7b). The sharing concept of the pFET header helps to minimize the extra area penalty when compared to one pFET header per bitcell. For example, FIG. 7a illustrates how a pFET header 710 may be shared between adjacent cells 720 and 730 to save area. In another example, FIG. 7b illustrates a pFET header 710 shared across an entire row 740. This type of integration helps eliminate the need for a separate early write wordline and reduction in circuit complexities.

Figure 8:
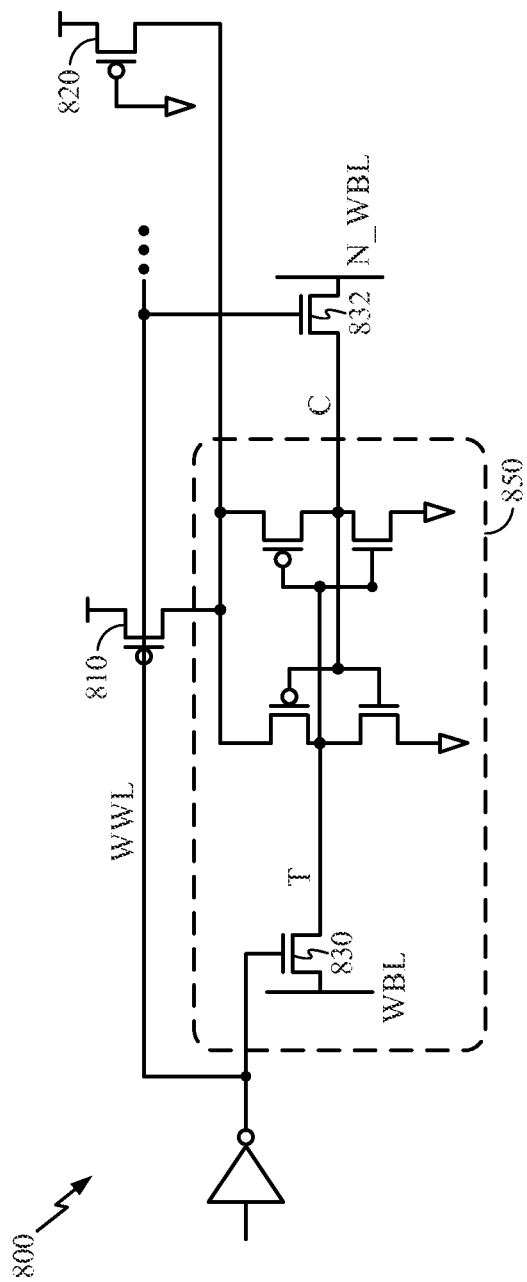
FIG. 8 illustrates an exemplary embodiment of a weakened pFET header that is connected to a secondary pFET device.

In yet another exemplary embodiment, FIG. 8 illustrates a circuit 800 that utilizes a header pFET 810 in combination with a pFET 820 that may be configured to connect to header pFET 810 in parallel. Such a design may be used instead of an ON/OFF pFET header as previously discussed and create a weakened path to ground. Wherein the other embodiments aim to completely break the path to VDD by using ON/OFF pFET headers 430 and 520 for example, circuit 800 uses a schematic to weaken header pFET 810 or alternatively weaken the path to ground by including pFET 820. In order to establish the weakened path, pFET 820 may be configured to be always ON, or it may further comprise a gate that is configured to be held at LOW. Having pFET 820 connect to header pFET in parallel allows header pFET 810 to turn ON when the passgate transistors 830 and 832 are OFF, and turn OFF when the passgate transistors 830 and 832 are ON. Circuit 800 may include a first common node T and a second common node C, wherein T includes a true bitline and C includes a complementary bitline. T is operatively configured to connect to the second terminal of first passgate transistor 830 and C is operatively configured to connect to the second terminal of the second passgate transistor 832 wherein T and C are driven to complementary logic voltages when performing a write operation on the bitcell.

Circuit 800 may be arranged in several ways. For example, pFET 820 utilized for a whole row of bitcells (not shown) or for each individual bitcell, such as bitcell 850. Utility of pFET 820 for an entire row or a bitcell may be incorporated in similar fashion as discussed above, for example in a similar way to how pFET headers 430 and 520 can be utilized for any number of bitcells in the same row. Weakening the path to ground may further refer to the inversion qualities of the MOSFET device, in this case header pFET 810. The ON/OFF controllability of the pFET header in the previous examples allowed for the pFET header to operate in the moderate or even strong inversion region of operation for the pFET header. As such, when pFET 820 is used in parallel with header pFET 810, this causes the value at the drain of pFET 820 to be HIGH and causes a weakening of the path of header pFET 810 to discharge to ground.

Figure 9:
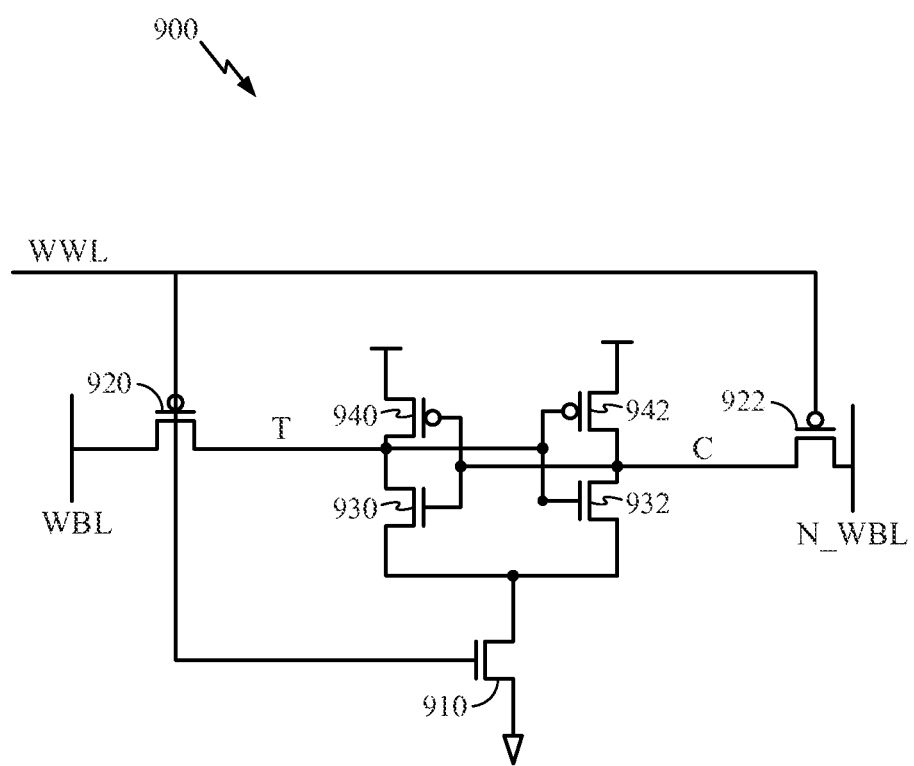
FIG. 9 illustrates an exemplary embodiment of an alternative approach to writing data including a footer nFET device to drive the circuit.

In yet another exemplary embodiment, FIG. 9 illustrates a circuit 900 with an alternative approach to writing data including a footer nFET device to drive the circuit. Circuit 900 shows nFET looter 910 operatively connected to VDD at its source, to pFET passgate transistors 920 and 922 at its gate, and the nFETs 930 and 932 at its drain. Unlike the other embodiments, the WWL in this case is an active LOW. This means that in order for write operations to take place, WWL will need to be LOW such that when WWL is LOW, the signal passes through pFET passgate transistors 920 and 922, activating pFET passgate transistors 920 and 922 and further turning on nFET footer 910. Turning on nFET footer 910 subsequently turns on nFETs 930 and 932 and turns OFF pFETs 940 and 942 leading to very little nFET-pFET contention and having internal nodes T and C pull up very fast. This is similar in result as having the internal nodes T and C pull down very fast due to lack of contention caused by the pFET header used in FIGS. 4-7. Additionally, nFET footer 910 may be configured to receive a voltage complementary to the voltage of the output port of the driver (WWL), and may further have a drain connected to the source of the nFETs 930 and 932. Circuit 900 further comprises pFETs 940 and 942 each having a source and a drain, wherein the drain is connected to a terminal of the first and second passgate transistors 920 and 922.

Figure 10:
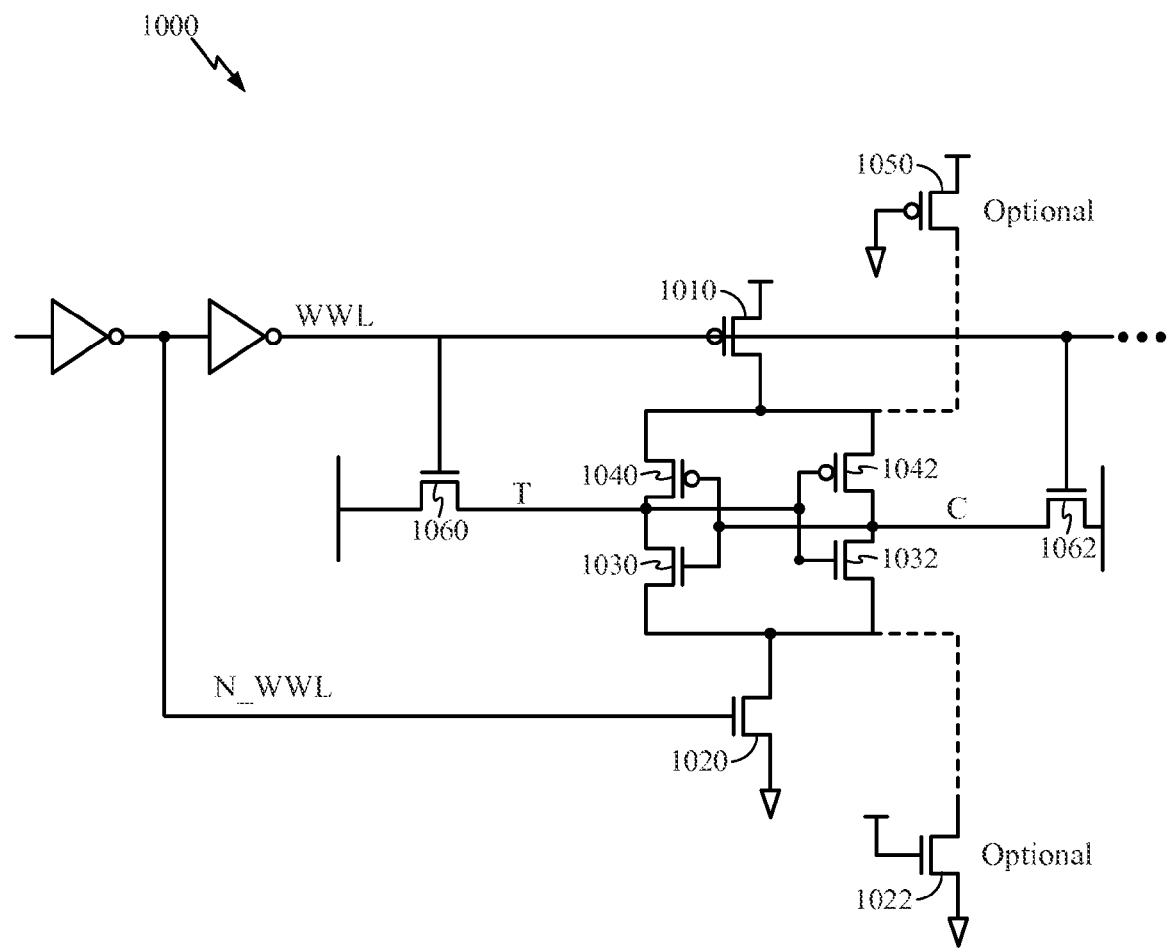
FIG. 10 illustrates an exemplary embodiment of a pFET header and nFET footer combination, the combination may also include a secondary pFET and the layout may be that is shared across an entire row.

It is further possible to combine several of the earlier embodiments together. For example, FIG. 10 illustrates such embodiment wherein circuit 1000 thus may further include header pFET 1010 added to the DIET footer design of circuit 900, wherein header pFET 1010 may have a gate connected to the output port of the driver and further may have a drain connected to the source of first pFET 1040 and to the source of second pFET 1042, wherein header pFET 1010 is configured to turn ON when the passgate transistors 1060 and 1062 are turned OFF, and turn OFF when the passgate transistors 1060 and 1062 are turned ON. Furthermore, footer nFET 1020 may be configured to have a drain connected to the source of first nFET 1030 and second pFET 1032, and may also be configured to turn ON when the passgate transistors are turned OFF, and turn OFF when the passgate transistors are turned ON. Furthermore, circuit 1000 may further include yet another earlier discussed embodiment wherein the path to ground may be further weakened by incorporating pFET 1050, which further includes a gate, wherein the gate is held LOW (causing pFET 1050 to be ON) and is configured to be connected in parallel to the header pFET.

Circuit 1000 may further include yet another pFET 1022 which including a gate, wherein the gate is connected to a supply rail and is configured to be connected in parallel to footer nFET 1020. Circuit 1000 may further include a first common node (T) and a second common node (C), wherein node T includes a true bitline and node C includes a complementary bitline, wherein node T is configured to connect, to the second terminal of first passgate transistor 1060 and node C is configured to connect to the second terminal of the second passgate transistor 1062. Nodes T and C may be driven to complementary logic voltages when performing a store operation on the bitcell. When driver output is logic value HIGH, the header pFET turns OFF, further causing the first pFET and second pFET to turn OFF.

FIG. 11 illustrates one exemplary embodiment of a method for improved low voltage write speed to a bitcell with a pFET header design. Method 1100 includes providing, 1110, a signal to a first and a second pass transistors to write to a bitcell, the bitcell includes a first pFET having a source and a drain, and a second pFET having a source and a drain; and providing, 1120, a second signal to a gate of a header pFET, wherein the header pFET includes a drain connected to the sources of first and second pFETs, wherein providing second signal to the gate of the header pFET further includes turning OFF, 1130, the first and second pFETs during a writing operation, wherein the second signal lags the first signal.

FIG. 12 illustrates yet another exemplary embodiment of a method for improved low voltage write speed to a bitcell with an nFET footer design. Method 1200 includes providing, 1210, a signal to a first and a second pass transistors to write to a bitcell, the bitcell includes a first nFET having a source and a drain, and a second nFET having a source and a drain; and providing, 1220, a second signal to a gate of a footer nFET, wherein the footer nFET includes a drain connected to the sources of first and second nFETs, wherein providing second signal to the gate of the footer nFET further includes turning OFF, 1230, the first and second nFETs during a writing operation.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for preventing displacement of high temporal locality fill buffers. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:
1. An apparatus comprising:
   a bitcell comprising
      a first pFET having a source and a drain;
      a second pFET having a source and a drain;
      a first passgate transistor having a first terminal and a second terminal connected to the drain of the first pFET;
      a second passgate transistor having a first terminal and a second terminal connected to the drain of the second pFET;
   a driver having an output port connected to the first terminals of the first and second passgate transistors; and a header pFET having a gate connected to the output port of the driver, and having a drain connected to the source of the first pFET and to the source of the second pFET.

2. The apparatus of claim 1, wherein the header pFET is configured to turn ON when the first and second passgate transistors are OFF, and turn OFF when the passgate transistors are ON.

3. The apparatus of claim 1, further comprising a first common node and a second common node, wherein the first common node comprises a true bitline and the second common node comprises a complementary bitline.

4. The apparatus of claim 3, wherein the first common node is operatively configured to connect to the second terminal of the first passgate transistor and the second common node is configured to connect to the second terminal of the second passgate transistor.

5. The apparatus of claim 4, wherein the first common node and the second common node are driven to complementary logic voltages when performing a write operation on the bitcell.

6. The apparatus of claim 5, wherein when a driver output is logic value HIGH, the header pFET turns OFF and causes the first pFET and second pFET to turn OFF.

7. The apparatus of claim 1, further comprising a third pFET comprising a gate, wherein the gate is held LOW, the third pFET configured to be connected in parallel to the header pFET.

8. The apparatus of claim 7, wherein the header pFET is configured to turn ON when the first and second passgate transistors are OFF, and turn OFF when the passgate transistors are ON.

9. The apparatus of claim 8, further comprising a first common node and a second common node, wherein the first common node comprises a true bitline and the second common node comprises a complementary bitline.

10. The apparatus of claim 9, wherein the first common node is operatively configured to connect to the second terminal of the first passgate transistor and the second common node is operatively configured to connect to the second terminal of the second passgate transistor.

11. The apparatus of claim 10, wherein the first common node and the second common node are driven to complementary logic voltages when performing a write operation on the bitcell.

12. An apparatus comprising:
a bitcell comprising
a first pFET having a source and a drain;
a second pFET having a source and a drain;
a first passgate transistor having a first terminal and a second terminal connected to the drain of the first pFET;
a second passgate transistor having a first terminal and a second terminal connected to the drain of the second pFET;
a driver having an input port, and having an output port connected to the first terminals of the first and second passgate transistors;
a header pFET having a gate connected to the input port of the driver, and having a drain connected to the source of the first pFET and to the source of the second pFET.

13. The apparatus of claim 12, wherein the header pFET is configured to turn ON when the first and second passgate transistors are OFF, and turn OFF when the passgate transistors are ON.

14. The apparatus of claim 13, further comprising a first common node and a second common node, wherein the first common node comprises a true bitline and the second common node comprises a complementary bitline.

15. The apparatus of claim 14, wherein the first common node is operatively configured to connect to the first terminal of the first passgate transistor and the second common node is configured to connect to the first terminal of the second passgate transistor.

16. The apparatus of claim 15, wherein the first common node and second common node are driven to complementary logic voltages when performing a write operation on the bitcell.

17. An apparatus comprising:
a bitcell comprising
a first nFET having a source and a drain;
a second nFET having a source and a drain;
a first passgate transistor having a first terminal and a second terminal connected to the drain of the first nFET;
a second passgate transistor having a first terminal and a second terminal connected to the drain of the second nFET;
a driver having an output port connected to the first terminals of the first and second passgate transistors; and
a footer nFET having a gate coupled to an input port of the driver and configured to receive a voltage complementary to a voltage of the output port of the driver, and having a drain connected to the source of the first nFET and the source of the second nFET.

18. The apparatus of claim 17, further comprising:
a first pFET having a source and a drain, wherein the drain of the first pFET is connected to the second terminal of the first passgate transistor; and
a second pFET having a source and a drain, wherein the drain of the second pFET is connected to the second terminal of the second passgate transistor.

19. The apparatus of claim 18, further comprising a header pFET having a gate connected to the output port of the driver and further having a drain connected to the source of the first pFET and to the source of the second pFET.

20. The apparatus of claim 19, wherein the header pFET is configured to turn ON when the first and second passgate transistors are turned OFF, and turn OFF when the passgate transistors are turned ON.

21. The apparatus of claim 19, wherein the footer nFET is configured to turn ON when the first and second passgate transistors are turned OFF, and turn OFF when the passgate transistors are turned ON.

22. The apparatus of claim 19, further comprising a third pFET comprising a gate, wherein the gate of the third pFET is held LOW, the third pFET configured to be connected in parallel to the header pFET.

23. The apparatus of claim 22, further comprising a third nFET comprising a gate, wherein the gate of the third nFET is connected to a supply rail, the third nFET configured to be connected in parallel to the footer nFET.

24. The apparatus of claim 23, further comprising a first common node and a second common node, wherein the first common node comprises a true bitline and the second common node comprises a complementary bitline.

25. The apparatus of claim 24, wherein the first common node is operatively configured to connect to the second terminal of the first passgate transistor and the second common node is operatively configured to connect to the second terminal of the second passgate transistor.

26. The apparatus of claim 25, wherein the first common node and the second common node are driven to complementary logic voltages when performing a store operation on the bitcell.

27. The apparatus of claim 26, wherein when a driver output is logic value HIGH, the header pFET turns OFF, further causing the first pFET and second pFET to turn OFF.

28. A method comprising:
providing a first signal to a first and a second pass transistors to write to a bitcell, the bitcell comprising a first pFET having a source and a drain, and a second pFET having a source and a drain; and
providing a second signal to a gate of a header pFET, wherein the header pFET comprises a drain connected to the sources of first and second pFETs, wherein the providing the second signal to the gate of the header pFET further includes turning OFF the first and second pFETs during a writing operation.

29. The method of claim 28, wherein the second signal lags the first signal.

30. A method comprising:
providing a first signal to a first and a second pass transistors to write to a bitcell, the bitcell comprising a first nFET having a source and a drain, and a second nFET having a source and a drain; and
providing a second signal to a gate of a footer nFET, wherein the footer nFET comprises a drain connected to the sources of first and second nFETs, wherein the providing the second signal to the gate of the footer nFET further includes turning OFF the first and second nFETs during a writing operation.

31. An apparatus comprising:
means for providing a first signal to a first and a second pass transistors to write to a bitcell, the bitcell comprising a first nFET having a source and a drain, and a second nFET having a source and a drain; and
means for providing a second signal to a gate of a footer nFET, wherein the footer nFET comprises a drain connected to the sources of first and second nFETs, wherein the means for providing the second signal to the gate of the footer nFET further comprises means for turning OFF the first and second nFETs during a writing operation.

32. An apparatus comprising:
a bitcell comprising
a first FET having a source and a drain;
a second FET having a source and a drain;
a first passgate transistor having a first terminal and a second terminal connected to the drain of the first FET;
a second passgate transistor having a first terminal and a second terminal connected to the drain of the second FET;
a driver having an output port connected to the first terminals of the first and second passgate transistors; and
a third FET having a gate connected to a port of the driver, and having a drain connected to the source of the first FET and to the source of the second FET.

33. A method comprising:
providing a first signal to a first pass transistor and a second pass transistor to write to a bitcell, the bitcell comprising a first FET having a source and a drain and a second FET having a source and a drain; and
providing a second signal to a gate of a third FET to turn OFF the first FET and the second FET during a writing operation, wherein the third FET comprises a drain connected to the source of first FET and the source of the second FET.

34. An apparatus comprising:
means for providing a first signal to a first pass transistor and a second pass transistor to write to a bitcell, the bitcell comprising a first FET having a source and a drain and a second FET having a source and a drain; and
means for providing a second signal to a gate of a third FET to turn OFF the first FET and the second FET during a writing operation, wherein the third FET comprises a drain connected to the source of first FET and the source of the second FET.

35. An apparatus comprising:
means for providing a first signal to a first pass transistor and a second pass transistor to write to a bitcell, the bitcell comprising a first pFET having a source and a drain and a second pFET having a source and a drain; and
means for providing a second signal to a gate of a header pFET, wherein the header pFET comprises a drain connected to the sources of first and second pFETs, wherein the means for providing the second signal to the gate of the header pFET further comprises means for turning OFF the first and second pFETs during a writing operation.

* * * * *